(12) United States Patent
Peng (10) Patent No.: US 6,269,117 B1
(45) Date of Patent: Jul. 31, 2001

(54) SYSTEM AND METHOD FOR ENHANCING DOWNSAMPLING OPERATIONS

(75) Inventor: Jason Peng, Sunnyvale, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/106,249

(22) Filed: Jun. 29, 1998

(51) Int. Cl.$^7$ ........................................................ H03H 7/30
(52) U.S. Cl. ............................ 375/232; 375/350; 708/323
(58) Field of Search .................................. 375/350, 352, 375/229, 232; 708/313, 319, 323, 306

(56) References Cited

U.S. PATENT DOCUMENTS

| | | | |
|---|---|---|---|
| 5,053,984 | * 10/1991 | Cavallotti et al. | 364/724.16 |
| 5,222,144 | * 6/1993 | Whikehart | 381/15 |
| 5,513,223 | * 4/1996 | Shoji | 375/350 |
| 5,515,402 | * 5/1996 | Chester | 375/350 |
| 5,732,337 | * 3/1998 | Wargnier et al. | 455/144 |
| 5,872,480 | * 2/1999 | Huang | 329/304 |
| 5,894,495 | * 4/1999 | Kase | 375/232 |
| 5,905,757 | * 4/1999 | Kundmann et al. | 375/229 |

OTHER PUBLICATIONS

Applications Engineering Staff of Analog Devices, DSP Division, "Digital Signal Processing Applications Using the ADSP–2100 Family", 1990, pp. 86–97.

* cited by examiner

*Primary Examiner*—Stephen Chin
*Assistant Examiner*—Dac V. Ha
(74) *Attorney, Agent, or Firm*—Gregory J. Koerner; Simon & Koerner LLP (57) ABSTRACT

A system comprises an enhanced downsampling operation for digital data. In the preferred embodiment, a downsampling filter has a quantity of filter coefficients equal to 4(a)+1, where (a) is an integer. In this case the even-numbered coefficients are, to the degree of accuracy required, equal to zero. Also the central even-numbered coefficient is equal to ½. As multiplication by ½ in a binary digital system may be executed by a simple right shift, the total number of coefficient-sample multiplications may be reduced to 2(a). The filter design wherein the even-numbered coefficients equal zero also has the additional benefit of reducing the number of storage locations for the filter coefficients. A further aspect of the present invention is the segregation of the input data stream into even and odd-numbered sample buffers.

24 Claims, 12 Drawing Sheets

| EVEN-CH0-PT0 |
|---|
| EVEN-CH1-PT0 |
| EVEN-CH2-PT0 |
| EVEN-CH3-PT0 |
| EVEN-CH4-PT0 |
| EVEN-CH5-PT0 |
| EVEN-CH6-PT0 |
| EVEN-CH7-PT0 |
| ODD-CH0-PT0 |
| ODD-CH1-PT0 |
| ODD-CH2-PT0 |
| ODD-CH3-PT0 |
| ODD-CH4-PT0 |
| ODD-CH5-PT0 |
| ODD-CH6-PT0 |
| ODD-CH7-PT0 |

Even-numbered sample, channel 0, pointer 0

Odd-numbered sample, channel 0, pointer 0

| EVEN-CH0-PT1 |
|---|
| EVEN-CH1-PT1 |
| EVEN-CH2-PT1 |
| EVEN-CH3-PT1 |
| EVEN-CH4-PT1 |
| EVEN-CH5-PT1 |
| EVEN-CH6-PT1 |
| EVEN-CH7-PT1 |

Even-numbered sample, channel 0, pointer 1

SYSTEM AND METHOD FOR ENHANCING DOWNSAMPLING OPERATIONS

BACKGROUND OF THE INVENTION

1. Field of the Invention

This invention relates generally to improvements in digital signal processing and specifically to a system and method for enhancing the efficiency of downsampling operations.

2. Description of the Background Art

The increased use of digital audio and video in the consumer market has challenged designers to produce digital signal processing technology with superior performance while using economical components. Often digital techniques which are well-known in the art require expensive processing hardware. In order to make use of inexpensive hardware, new techniques must be invented.

One technique that is used in digital signal processing is downsampling. The need for downsampling arises when the source of digitized signals provides digital samples at a higher sampling rate than the receiver of the digital signals can accept. In the case where the source sampling rate MR is an integral multiple M of the receiving sampling rate R, it would appear that simply deleting (M−1) samples out of M samples would yield a digital signal of the correct sample receiving rate R. In reality, this significantly reduces the accuracy of the resultant signal.

In order to downsample, defined as converting a higher sampling rate digital signal to a lower sampling rate digital signal, a downsampling filter is required. This downsampling filter makes use of the signal content of a number of neighboring samples from the digital signal at the MR rate to give a best representation of the signal at the R rate. The downsampling filter is often implemented as a Finite Impulse Response (FIR) filter. Let the digital signal at the rate of MR be represented by the function x(n) of the discrete variable n, and the corresponding digital signal at the rate of R be represented by the function y(m) of the discrete variable m. In this case the discrete variable m occurs once for every M'th occurrence of discrete variable n. If x(n) is known, a FIR filter representation of the calculation of y(m) from x(n) may be expressed by the following equation:

$$y(m) = \sum_{k=0}^{N-1} h(k)x(Mm - k)$$

where k is the summation index, h(k) are constants called the filter coefficients, and N is called the length of the filter.

In the case of digital audio, it is often necessary to downsample from a digital audio bitstream arriving at a rate twice that which can be accepted by a low-cost digital-to-analog converter (DAC). However, in the case of digital audio, very high quality is required and this causes the number N of filter coefficients h(k) to be large. The result is that both the processing power required from a digital signal processing (DSP) microprocessor and the size of the memory required to store the set of N coefficients cannot be realized by the most economical devices.

SUMMARY OF THE INVENTION

The present invention includes a system and method for enhancing the downsampling operations for digital data. Downsampling is an operation in which sample values, which are the digital representation of an analog signal, are converted to have a lower sample rate. In the preferred embodiment, this invention reduces the processing power and storage required for downsampling by using a finite impulse response (FIR) filter technique. This filter consists of forming the sum of the products of adjacent sample values of the digital data with a corresponding series of constants called filter coefficients. A filter is designed with the number of filter coefficients preferably equal to 4(a)+1, where (a) is an integer called the filter length parameter. In this embodiment, the non-central even-numbered coefficients are, to the degree of accuracy required, equal to zero. Also, the central even-numbered coefficient is equal to ½. Because multiplication by ½ in a binary digital system may be executed by a simple right shift of a binary word, the total number of coefficient-sample multiplications may be reduced to 2(a). This process represents a savings of slightly over 50% in the number of multiplications required in the execution of the FIR filtering process. As the multiplications represent the most computation-intensive use of a microprocessor, a 50% reduction in the number of multiplications represents an overall savings in computer use of approximately 50%.

In accordance with the present invention, the filter design wherein the even-numbered coefficients equal zero also has the additional benefit of reducing the number of storage locations necessary for the filter coefficients. Because non-volatile storage is at a premium in most cost-effective microprocessors, and since many applications such as digital audio require a filter with a large number of filter coefficients for the necessary accuracy, this is a significant benefit of the present invention.

A further aspect of the present invention is the segregation of the input data stream into even and odd numbered sample buffers. With input buffers thus organized, it is possible to use software pointers and obviate the use of modulo-power-of-2 addressing. Because addressing using this mode is not compatible with assembly language, the present invention allows the designer to write the application code in assembly language to achieve better system performance.

DETAILED DESCRIPTION OF THE PREFERRED EMBODIMENT

The present invention relates to an improvement in digital signal processing. The following description is presented to enable one of ordinary skill in the art to make and use the invention and is provided in the context of a patent application and its requirements. The present invention is specifically disclosed in the environment of processing digital audio in a digital video disk (DVD) playback system. However, the present invention may be practiced wherever the necessity for downsampling occurs. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

In the preferred embodiment, the present invention comprises an enhanced downsampling operation for digital data at a ratio of 2 to 1. A filter is designed with the number of coefficients preferably equal to 4(a)+1, where (a) is an integer. In this case the even-numbered coefficients are, to the degree of accuracy required, equal to zero. Also the central even-numbered coefficient is equal to ½. As multiplication by ½ in a binary digital system may be executed by a simple right shift, the total number of coefficient-sample multiplications may be reduced to 2(a). The filter design wherein the even-numbered coefficients equal zero also has the additional benefit of reducing the number of storage locations for the filter coefficients. A further aspect of the present invention is the segregation of the input data stream into even and odd-numbered sample buffers.

Figure 1:
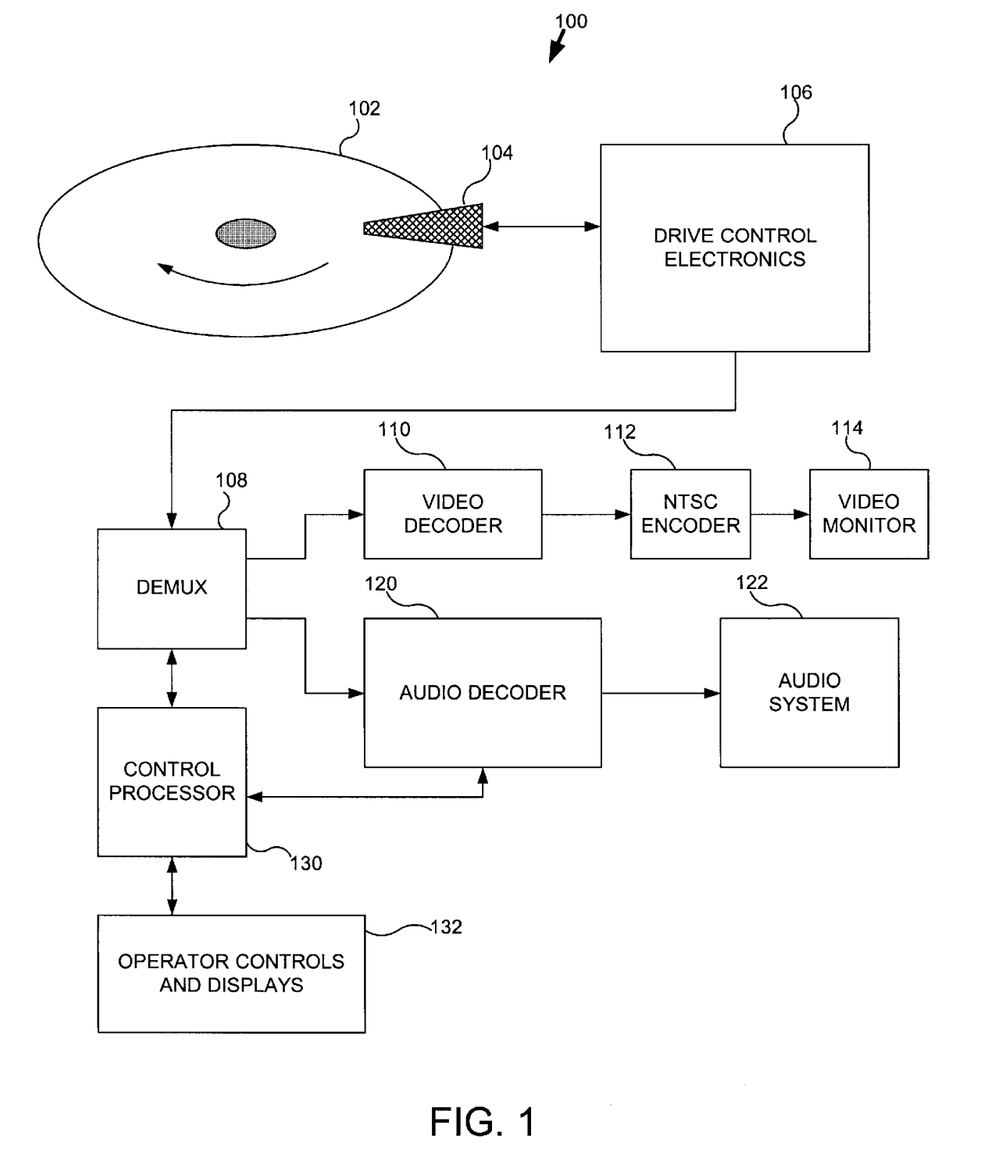
FIG. 1 is a block diagram of one embodiment of a Digital Video Disk playback system, in accordance with the present invention.

Referring now to FIG. 1, a block diagram of one embodiment of a DVD playback system 100 is shown, in accordance with the present invention. In the preferred embodiment, DVD playback system 100 includes DVD 102, head-arm assembly 104, drive control electronics 106, demultiplexor 108, video decoder 110, National Television Standards Committee (NTSC) encoder 112, video monitor 114, audio decoder 120, audio system 122, control processor 130, and operator controls and displays 132. In the preferred embodiment, DVD 102 is an optical disk platter which contains digital representations of audio and video information. DVD 102 rotates in playback system 100 and the audio and video data on DVD 102 is read by head-arm assembly 104 under control of drive control electronics 106. Drive control electronics 106 extracts a combined audio and video digital bitstream from the information read by head-arm assembly 104 and sends the combined digital bitstream to demultiplexor 108.

Demultiplexor 108 separates the audio and video bitstreams from the combined digital bitstream. The video bistream, preferably in Motion Picture Experts Group 2 (MPEG-2) format, is sent for processing by video decoder 110. After the video is decoded, it is then encoded in an analog format using NTSC encoder 112 and sent for display on video monitor 114.

In the preferred embodiment of the present invention, the source format for the audio data encoded in the combined digital bitstream entering demultiplexor 108 may be MPEG-2 audio data, Dolby® Audio Compression (AC-3) audio data, or Linear Pulse-Code Modulation (LPCM) audio data. DVD 102 may have more than one audio representation format on a single disk. In each case, the audio data preferably contains multiple channels of information. For example, MPEG-2 contains up to 8 distinct channels of audio and AC-3 contains 6 distinct channels of audio. In the case of MPEG-2 and AC-3, these multiple audio channels are preferably converted into LPCM format by decompression circuits in demultiplexor 108. The LPCM audio data arrives at audio decoder 120 in a single audio bitstream. Then, audio decoder 120 preferably reads a register written by the control processor 130, which tells audio decoder 120 which of the formats is represented on a given DVD 102. Then, audio decoder 120 allocates its internal storage accordingly for storing and processing the audio data. The output signals of audio decoder 120 are analog audio signals which may be used to drive a standard audio system 122 containing amplifiers and loudspeakers.

Figure 2:
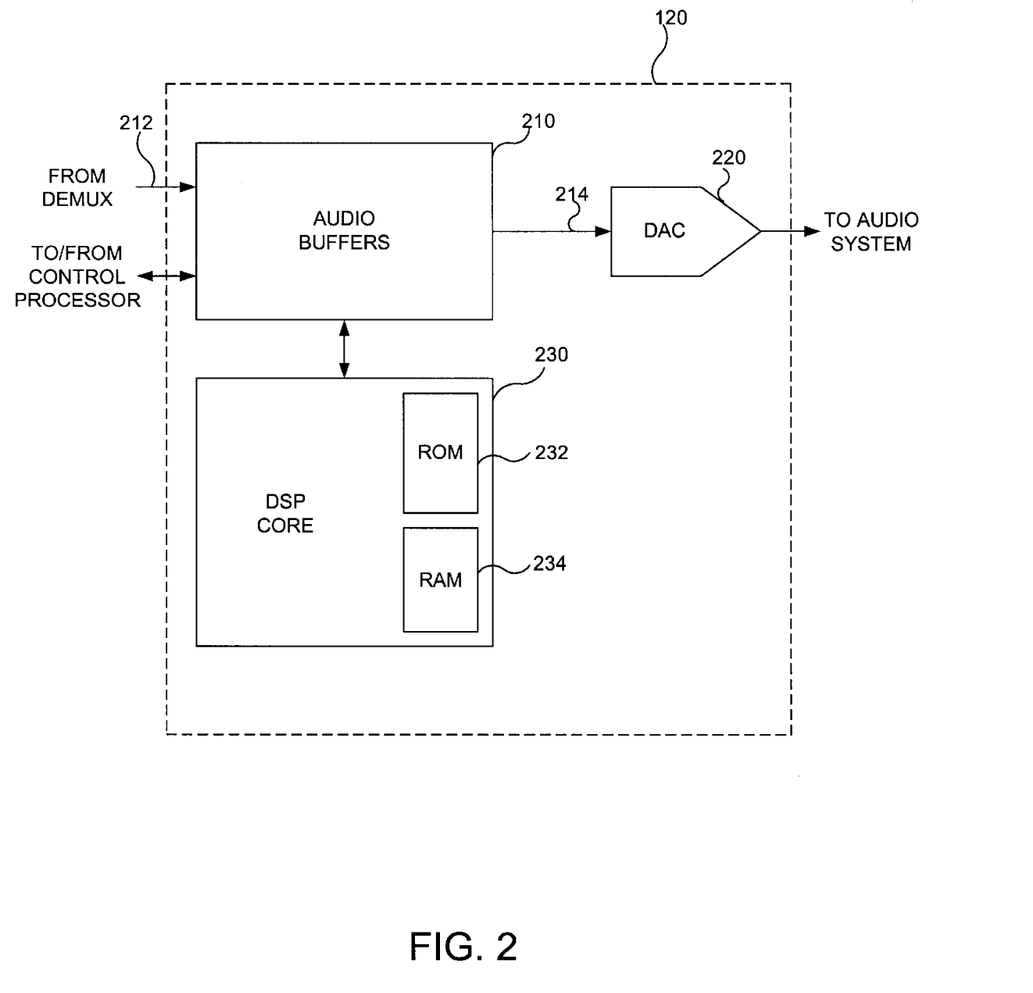
FIG. 2 is a block diagram of one embodiment of the audio decoder of FIG. 1, in accordance with the present invention.

Referring now to FIG. 2, a block diagram of one embodiment of the audio decoder 120 of FIG. 1 is shown, in accordance with the present invention. Audio decoder 120 preferably contains audio buffers 210 which receive the incoming audio bitstream, hold the digital audio signals during processing by the DSP core 230, and store the output digital audio for conversion by the multichannel digital-to-analog converter (DAC) 220. In the preferred embodiment, the audio bitstream (preferably in LPCM format) may arrive on signal line 212 at a sample rate of 96 kHz, which corresponds to a digital bit-rate from approximately 1.5 Mbps to 6.2 Mbps, depending upon the number of channels and the number of bits per sample. The bit rates are determined by the design specification for DVD 102. In the preferred embodiment, DAC 220 is selected on the basis of cost, and receives audio samples at a sample rate of 48 kHz over signal line 214. This difference in sample data rates necessitates downsampling the processed digital audio at a ratio of 2 to 1.

DSP core 230 is responsible for performing the data manipulations necessary in the downsampling operation. DSP core 230 preferably contains a small amount of read-only memory (ROM) 232 and random-access memory (RAM) 234. The limitations of the size of ROM 232 cause difficulties in designing the digital filter used for downsampling, because ROM 232 must contain both the executable code for the digital filter and also the filter coefficients. Because the requirements for digital audio demand very high fidelity, the filter length must be long, which results in large number of required filter coefficients.

Figure 3:
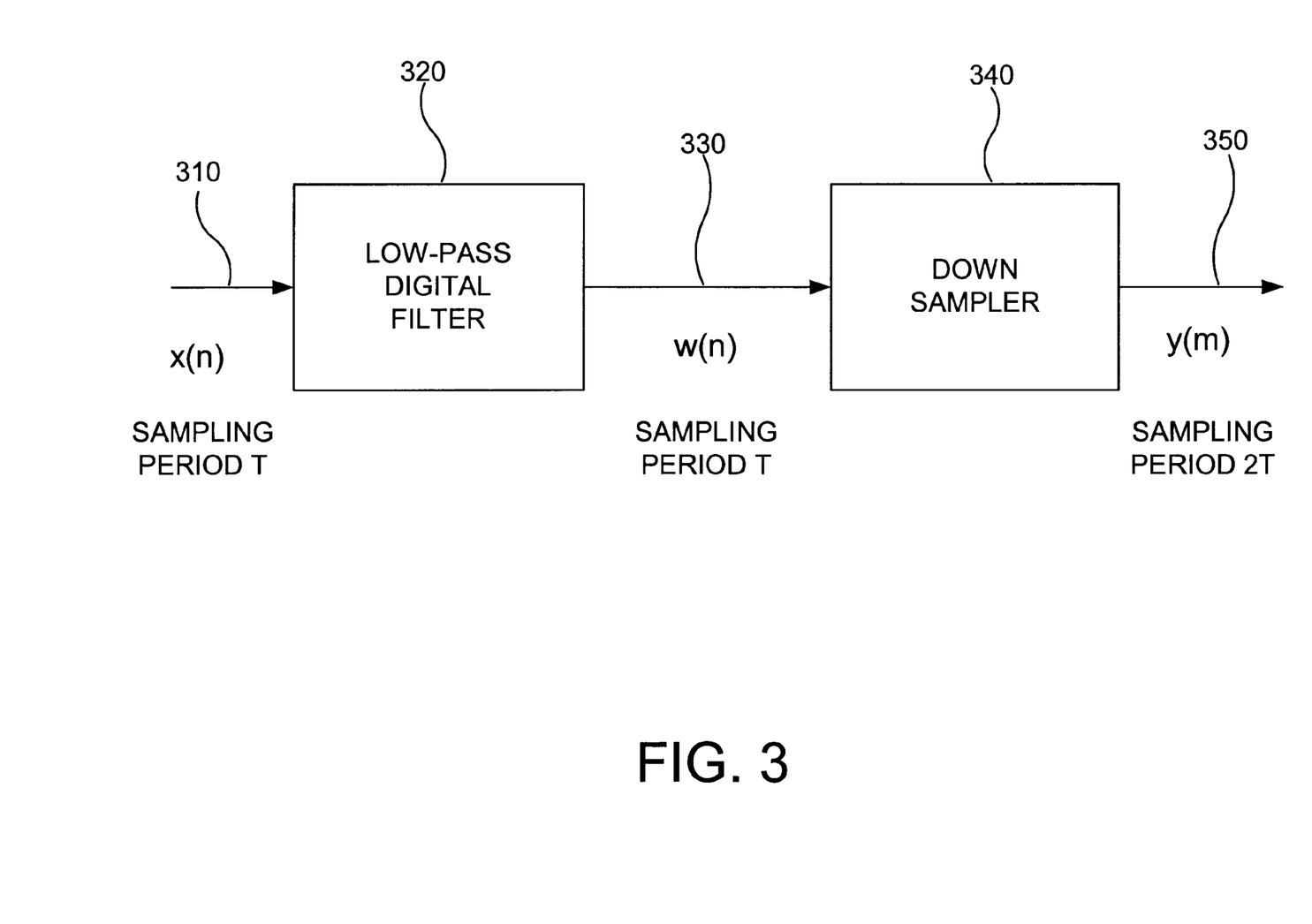
FIG. 3 is a block diagram for the logical process of 2-to-1 downsampling.

Referring now to FIG. 3, a block diagram for the logical process of 2-to-1 downsampling is shown. Digital samples arrive on signal line 310 with a sampling period of T that corresponds to a frequency of 1/T. A finite impulse response (FIR) filter designed as a low-pass digital filter 320 replaces the input sequence of samples as they arrive with a new, low-pass filtered output sequence of samples, also with a sampling period of T, so that each new output sample is a weighted average of the corresponding input sample and its adjacent samples. If the input sequence of samples is represented by function x(n) of the discrete variable n, and the low-pass filtered sequence is represented by function w(n), then each sample w(n) is given by the following equation:

$$w(n) = \sum_{k=0}^{N-1} h(k)x(n-k)$$

where k is the summation index, h(k) are constants called the filter coefficients, and N is called the length of the filter. Once the low-pass filter 320 has generated the low-pass filtered function w(n) on signal line 330, the down sampler 340 deletes alternate elements of w(n) to form function y(m) of discrete variable m, where discrete variable m occurs once for alternate occurrences of discrete variable n. Function y(m) therefore has a sampling period twice as long as T, corresponding to a frequency of 1/2T.

As is well known in the art, it is also possible to change the ordering of the low-pass filter 320 and downsampler 340 of FIG. 3. This allows the designer to not calculate those filtered samples of function w(n) which are ultimately going to be discarded. The function y(m) may therefore be expressed as in the following equation:

$$y(m) = \sum_{k=0}^{N-1} h(k)x(2m-k)$$

where the right-hand side of the above equation is referred to below as the filter sum.

In the preferred embodiment of the present invention, additional reductions in calculations are made by the design of the digital filter. The length of the filter N is selected to be 4(a)+1, where filter-length parameter (a) is an integer. In this case, the odd-numbered filter coefficients h(1), h(3), etc. have significant values. The even-numbered coefficients h(0), h(2), etc. are substantially equal to zero, with the exception of the central even-numbered coefficient h(2a). This central even-numbered coefficient h(2a) is substantially equal to 0.5 decimal.

Due to rounding errors in binary fixed-point multipliers, multiplying a sample value by one of the non-central even-numbered coefficients, which are substantially equal to zero, results in a product which is substantially equal to zero. For this reason, the present invention advantageously ignores all even-numbered coefficients (except for the central one) in the filter calculations. In the present invention, these even-numbered coefficients are not stored, nor are calculations made with them.

Because the central even-numbered coefficient h(2a) is substantially equal to the value of 0.5 decimal, another numerical multiplication may be avoided. Rather than perform the fixed-point multiplication h(2a)×(2m−2a) in the filter calculation, in the present invention, the sample x(2m−2a) is logically shifted right one bit. This corresponds to a binary division by 2, and eliminates one more fixed-point multiplication.

The above elimination of fixed-point multiplications by all of the even-numbered coefficients results in reducing the number of fixed-point multiplications by slightly more than one-half. Because the fixed-point multiplications are the computation-intensive part of the filtering process, this reduction significantly lowers the processing requirements of the DSP core 230 by about one-half. In the preferred embodiment of the present invention, the filter-length constant (a)=14 and corresponds to a filter length of 57 coefficients. Eliminating the need to store the even-numbered coefficients means that only 28 coefficients need be stored in ROM 232.

Figure 4:
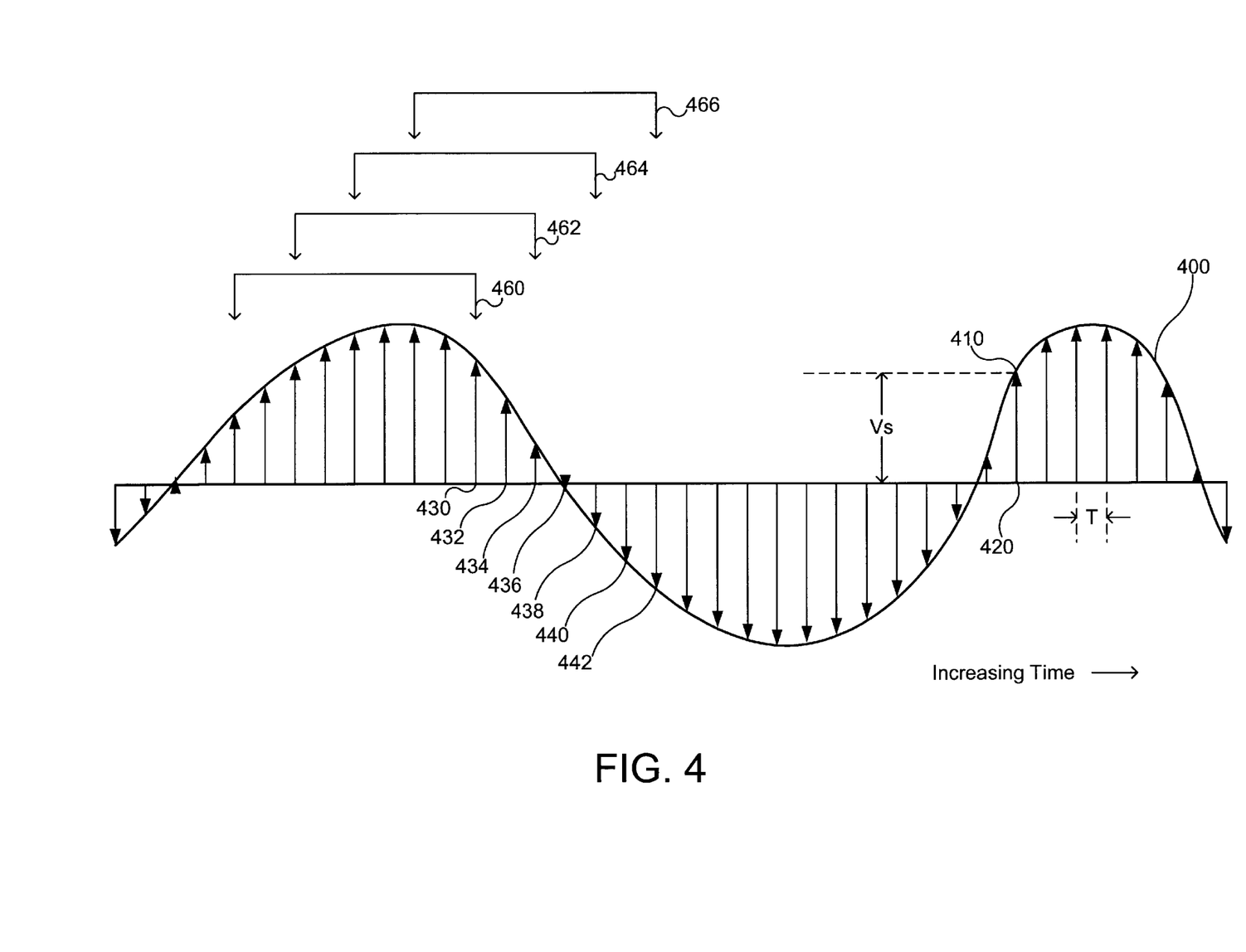
FIG. 4 is an exemplary drawing of selecting sample values in a sampled waveform, in accordance with the present invention.

Referring now to FIG. 4, an exemplary drawing of selecting sample values in a sampled waveform is shown, in accordance with the present invention. FIG. 4 graphically displays an example of LPCM audio. A continuous waveform 400 corresponding to a source analog audio waveform is represented by samples at time periods T apart, corresponding to a frequency of 1/T. An exemplary value 410 on the continuous waveform 400 is represented by an exemplary sample value 420, corresponding to the amplitude Vs, is represented by a binary digital number. In the present invention the exemplary sample value 420 may be represented by 16 bit, 20 bit, or 24 bit words.

For the sake of illustration, in FIG. 4, the filter length parameter (a)=2, for a filter length of 4(2)+1=9. In calculating the filter sum, the sample value under consideration and the preceding eight sample values are each in turn multiplied by a corresponding filter coefficient. These products are then added to form the filter sum. The nine adjacent sample values are referred to as a sample group. For example, the sample group enclosed by bracket 460 is used in the calculation of the filtered version for sample 430. Notice that sample value 430 itself is multiplied by h(0), and hence is one of the sample values multiplied by a zero-valued even-numbered filter coefficient. As mentioned in the discussion of FIG. 3 above, the sample values which are not used in the downsampling need not be calculated. Hence the calculation for the filtered version of sample value 432 is omitted, and the next calculations are for the filtered version of sample value 434. The sample group enclosed by bracket 462 is used in the calculation of the filtered version for sample value 434.

The calculated filtered values of the LPCM signal are thus calculated in sequence progressing from the sample group enclosed by brackets 460, 462, 464, and 466 in turn. Because the filtered values for alternating sample values need not be calculated, and thus because the filter calculation progresses ahead 2 samples at a time, all of the individual sample values will maintain their status as either "even" or "odd" samples. Each individual sample value will be multiplied in turn by many of the filter coefficients h(k), but any particular sample value will always be multiplied with either an even-numbered filter coefficient or an odd-numbered filter coefficient. In the present invention this preservation of a given sample's status is exploited to segregate incoming sample values into even and odd buffers.

Figure 5:
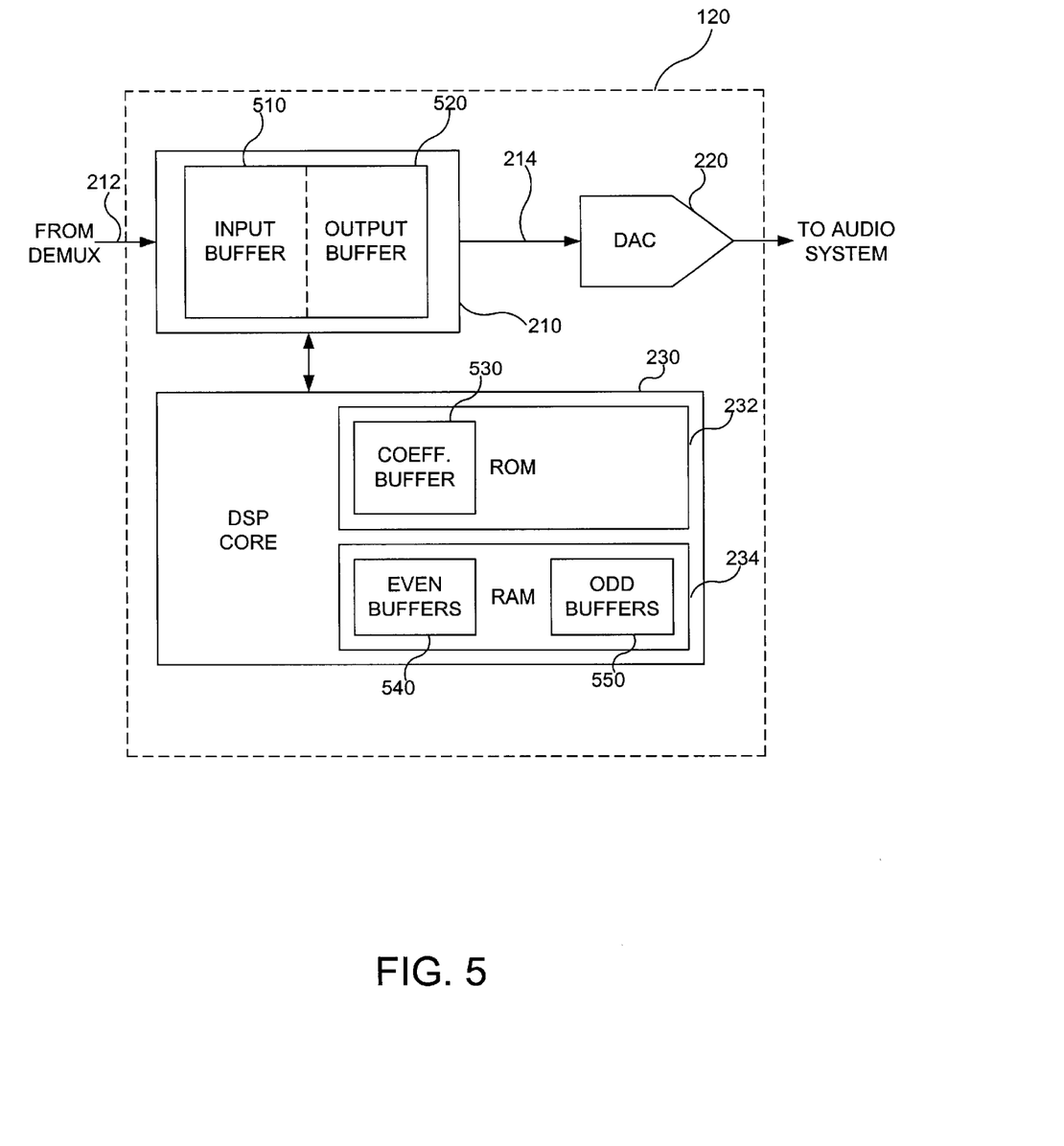
FIG. 5 is a diagram showing one embodiment of memory allocation, in accordance with the present invention.

Referring now to FIG. 5, a diagram shows one embodiment of memory allocation, in accordance with the present invention. DSP core 230 receives multichannel audio sample values on signal line 212, and places the audio sample values in order of receipt into a single input buffer 510 contained within audio buffers 210. DSP core 230 then preferably places even samples (for each channel) into an even buffer 540, and odd samples (for each channel) into an odd buffer 550 to support efficient computation of the filter. Odd samples are fixed-point multiplied with odd-numbered filter coefficients, and even samples are either omitted or logically right shifted (central even sample value). There is preferably an even buffer 540 and an odd buffer 550 for each audio channel supported. After the filter calculations are performed, for the filtered sample values are placed into output buffer 520 for transmission to DAC 220.

Figures 6A, 6B, 6C:
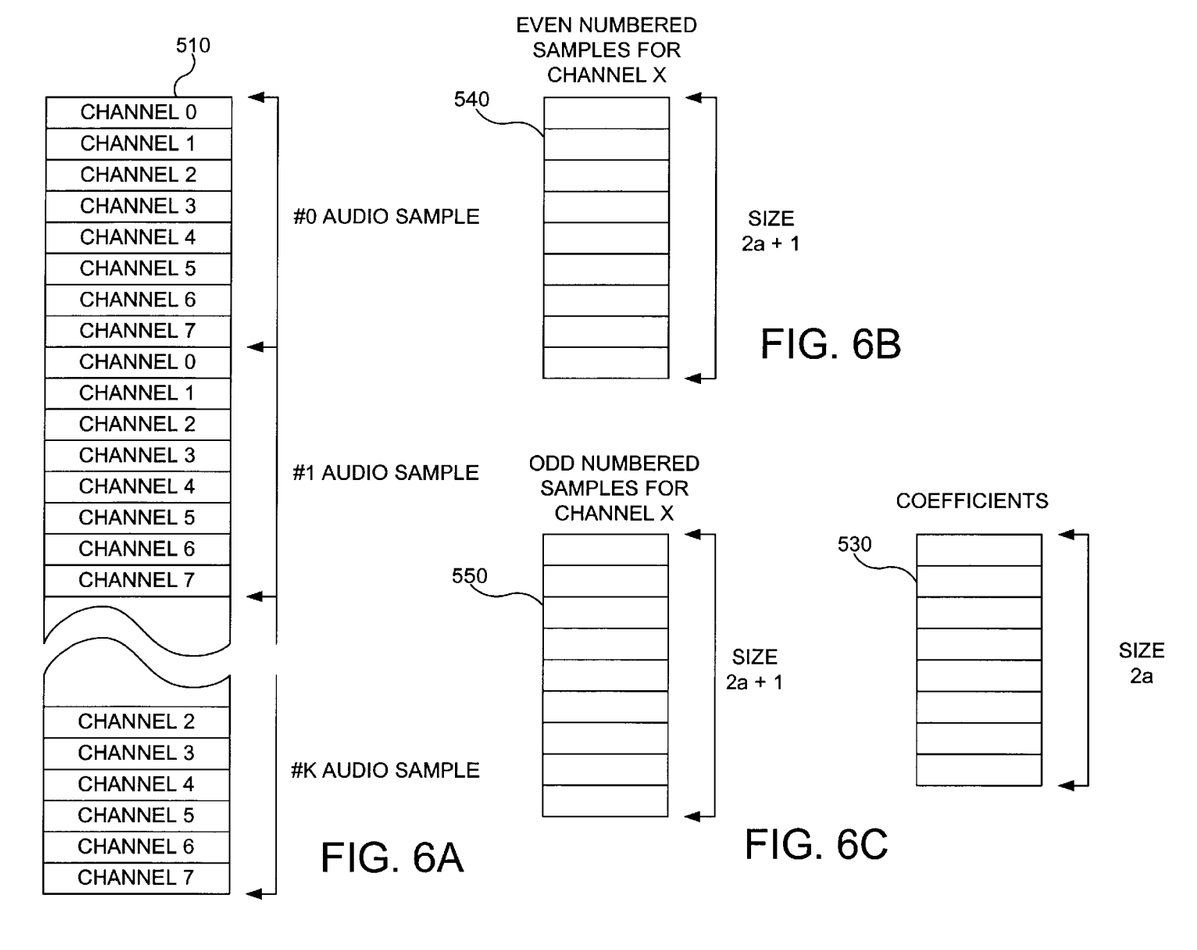
FIGS. 6A, 6B, and 6C are diagrams showing one embodiment of channel sample buffering, in accordance with the present invention.

Referring now to FIGS. 6A, 6B, and 6C, these diagrams show one embodiment of channel sample buffering, in accordance with the present invention. FIG. 6A shows the structure of input buffer 510. The LPCM audio bitstream arriving on signal line 212 contains corresponding audio sample values for up to eight independent audio channels, numbered 0 through 7. The input buffer 510 functions as a ring buffer, endlessly cycling through the audio sample values as they arrive. An even buffer 540 and odd buffer 550 are allocated for each of these channels. In FIG. 6B, a typical even buffer 540 in DSP RAM 234 is shown for channel number X. This even buffer 540 is also organized as a ring, having a size just sufficient to contain all of the even-numbered samples of a sample group required to compute a filter sum. In the FIG. 6B embodiment the size of even buffer 540 is equal to 2(a)+1.

FIG. 6C shows the corresponding odd buffer 550 in DSP RAM 234. Because each sample group contains one fewer odd sample values than even sample values, the odd buffer 550 would need to contain 2(a) sample values, corresponding to the 2(a) filter coefficients stored in the coefficient buffer 530 in ROM 232. In the present invention, the odd buffer 550 is sized with one more location than is minimally necessary and contains 2(a)+1 locations. The size was selected to allow the same buffer size for even and odd buffers. This additionally allows for an efficient pointer scheme to control the buffer as part of the present invention. The pointers will be discussed in detail below in conjunction with FIGS. 8 through 11.

Because the sample values in the sample group are divided between the even buffer 540 shown in FIG. 6B and the odd buffer 550 shown in FIG. 6C, it is possible to efficiently calculate the filtered version of each sample value. The only sample value of interest in even buffer 540 is the central even sample value, because the rest of the even sample values will be considered to be multiplied by zero and add nothing to the sum. A pointer (discussed below) tracks the location of the current central even sample value, allowing it to be logically right shifted and added to the filter sum. The sample values in odd buffer 550 are multiplied with their counterpart coefficients from coefficient buffer 530, and these products are added together with the right-shifted central even sample to form the filter sum. Again, pointers (discussed below) are used to match the appropriate sample values with their corresponding coefficients.

Figure 7:
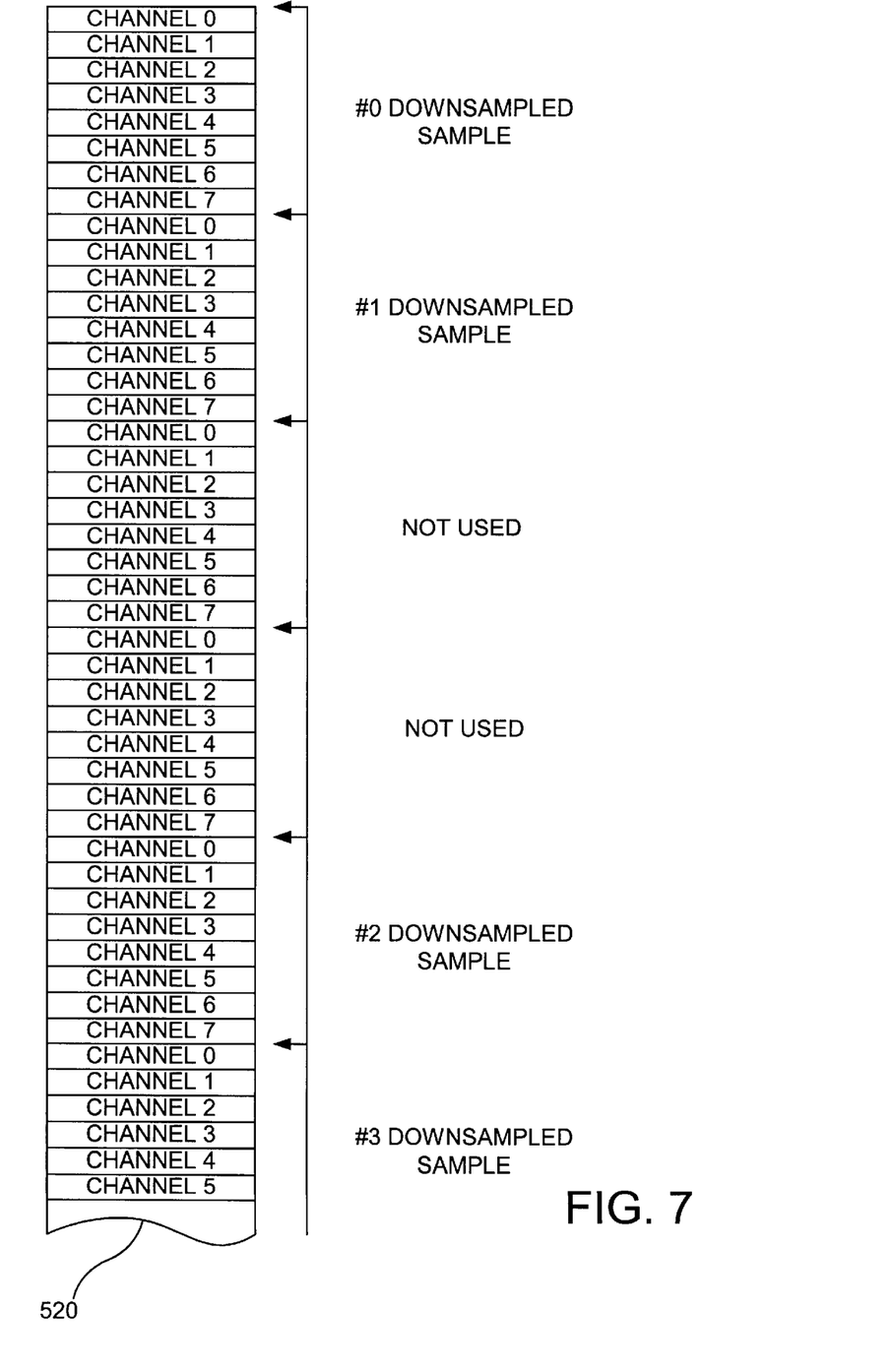
FIG. 7 is a diagram of one embodiment of the structure of the output buffer of FIG. 5, in accordance with the present invention.

Referring now to FIG. 7, a diagram shows one embodiment of the structure of the output buffer 520 of FIG. 5, in accordance with the present invention. Output buffer 520 is shown and discussed as though it occupies a separate series of memory locations from input buffer 510. However, in the preferred embodiment of the present invention, output buffer 520 uses common memory with the input buffer 510 and may overwrite input sample values no longer needed for calculating filter sums with newly downsampled output sample values. FIG. 7 shows pairs of groups of output samples, which come about from having processed four groups of input samples.

Output buffer 520 is constructed with the downsampled sample values stored in channel order, as was the case with the input bitstream, to support outputting data in LPCM format. DAC 220 sends DSP core 230 an interrupt when ready to convert a sampled value to an analog voltage. DSP core 230 services this interrupt and passes the next filtered sample from output buffer 210 to DAC 220.

Figure 8:
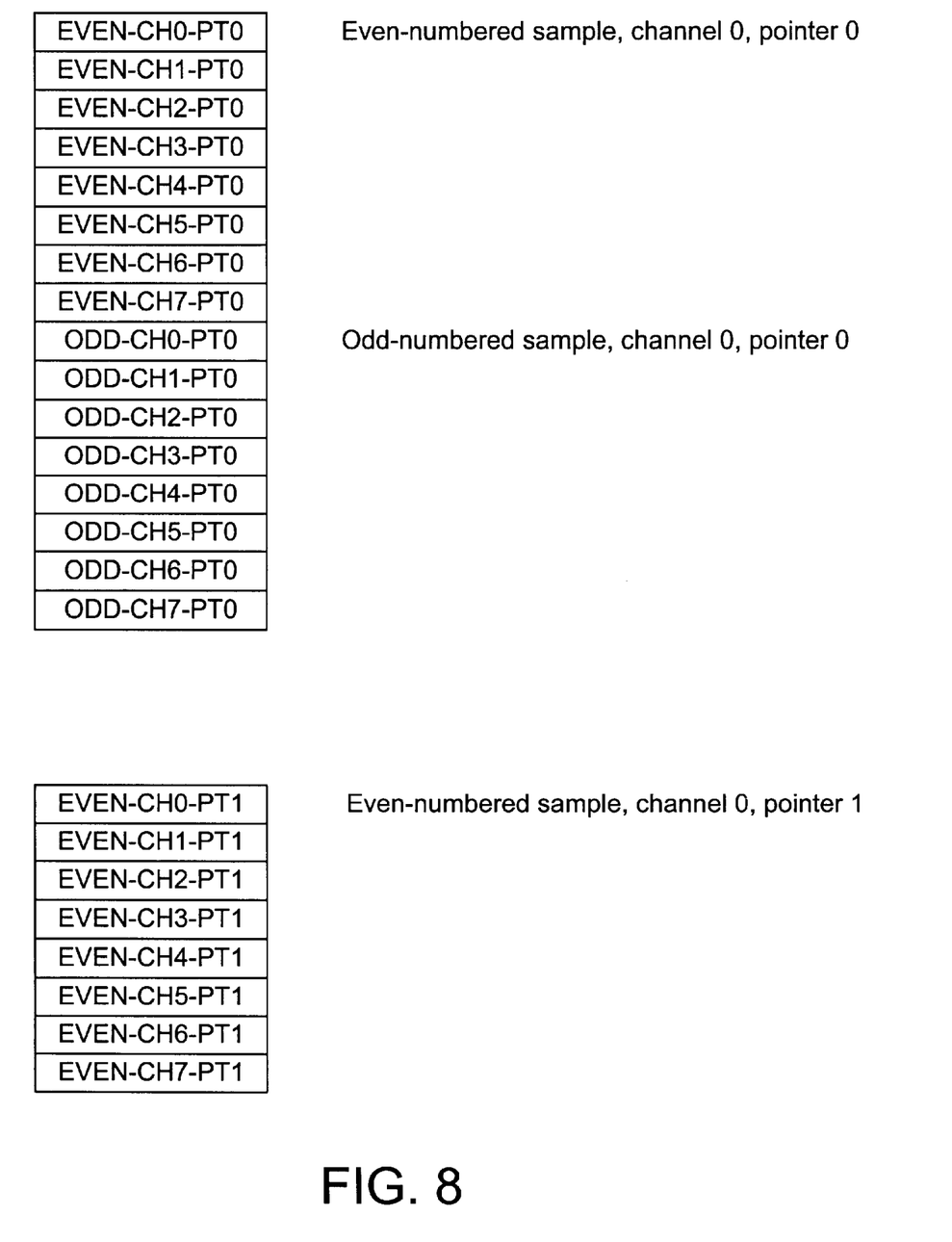
FIG. 8 is a diagram showing one embodiment of the pointers used with the sample buffers of FIG. 5, in accordance with the present invention.

Referring now to FIG. 8, a diagram shows one embodiment of the pointers used with the sample buffers, in accordance with the present invention. These pointers are used to control access to even buffers 540 and odd buffers 550. By using these pointers, the need for the software tools to support a modulo power-of-2 addressing mode is eliminated. This mode is not supported by assembly language, and thus the present invention allows for the use of efficient assembly language coding. The EVEN-CHX-PT0 and ODD-CHX-PT0 pointers point to the location in even buffers 540 and odd buffers 550, respectively, where the currently accessed sample value is located. A separate set of pointers EVEN-CHX-PT1 is used to point to the central even sample value. This is the significant sample value, for, as described above, it is logically right shifted and added to the filter sum.

Figure 9A:
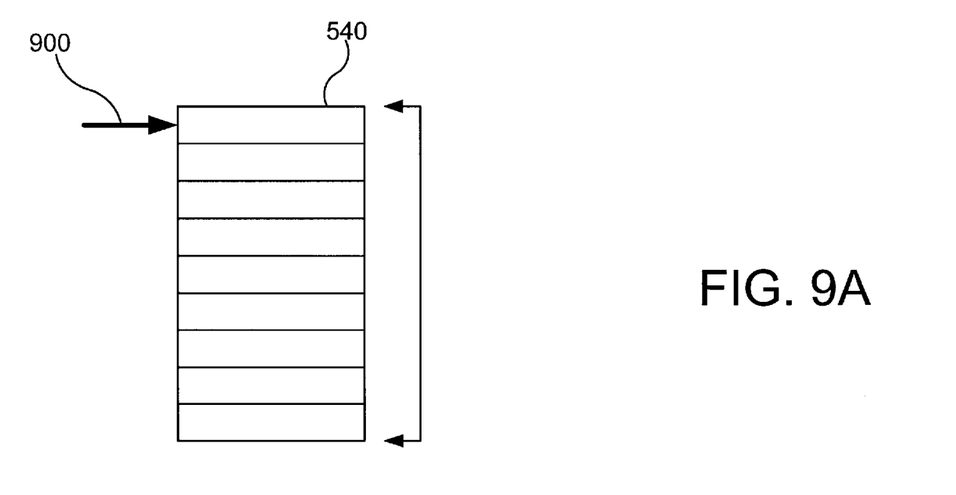
FIGS. 9A, 9B, and 9C are diagrams showing the preferred embodiment for operation of an EVEN-CHX-PT0 pointer, in accordance with the present invention.
Figure 9B:
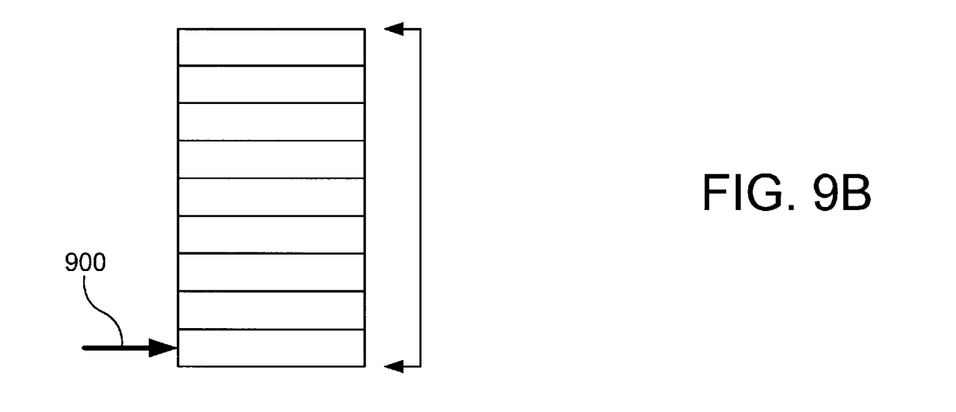
Figure 9C:
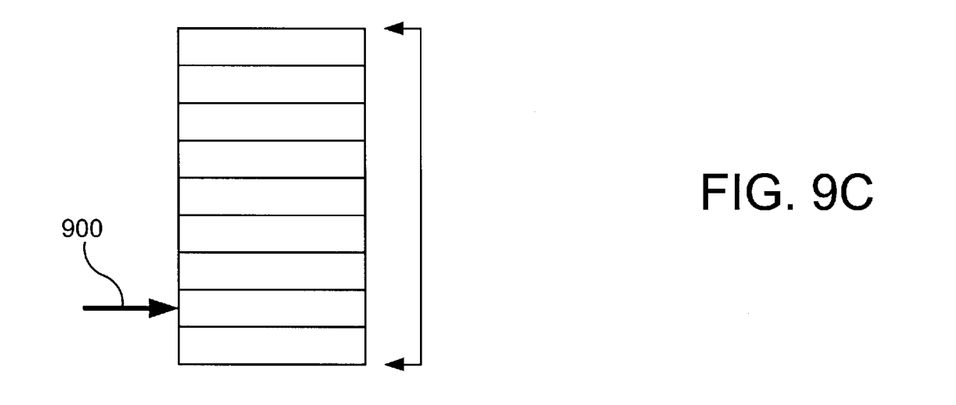

Referring now to FIGS. 9A, 9B, and 9C, a series of diagrams shows one embodiment of the operation of an EVEN-CHX-PT0 pointer 900, in accordance with the present invention. The number of locations in even buffer 540 is preferably 2(a)+1, which for the purpose of illustration now has value (a)=4 so that 2(a)+1=9. In FIG. 9A, the pointer 900 is pointing at the location of the most recent even sample value. This is the sample value which would be multiplied by h(0), except that in the present invention this product is approximated by zero as described above. Near the end of the calculation of the current filtered sample value, pointer 900 is advanced 2(a)+1 locations to the location of the oldest even sample value, as shown in FIG. 9B. Because even buffer 540 is designed to operate as a ring buffer, this oldest even sample is then written over with the subsequent most recent even sample. Pointer 900 thus is pointing at the current most recent even sample. After the next filter sum is calculated, pointer 900 is advanced again 2(a)+1 locations, as shown in FIG. 9C. In the case shown in FIG. 9C, the advancing of this many locations exceeds the length of even buffer 540 and then returns to the top of even buffer 540. Hence, in FIG. 9C pointer 900 points at a location one before that shown in FIG. 9B. As time progresses, the pointer 900 proceeds up even buffer 540, always pointing to the location for storing the current most recent even sample. Therefore, pointer 900 allows even buffer 540 to act as a ring buffer without modulo power-of-2 addressing.

Figure 10A:
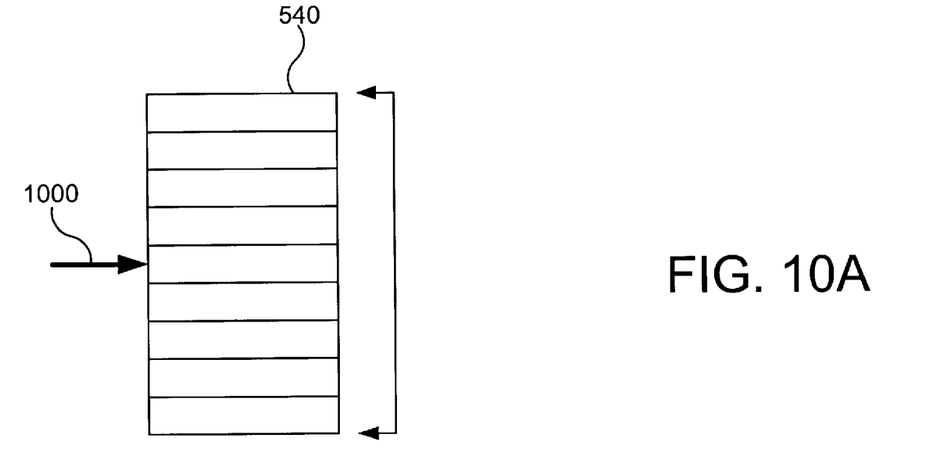
FIGS. 10A, 10B, and 10C are diagrams showing the preferred embodiment for operation of an EVEN-CHX-PT1 pointer, in accordance with the present invention.
Figure 10B:
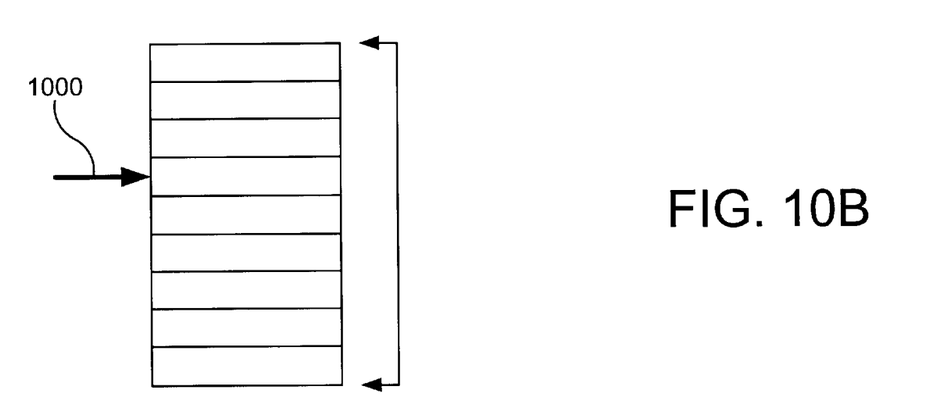
Figure 10C:
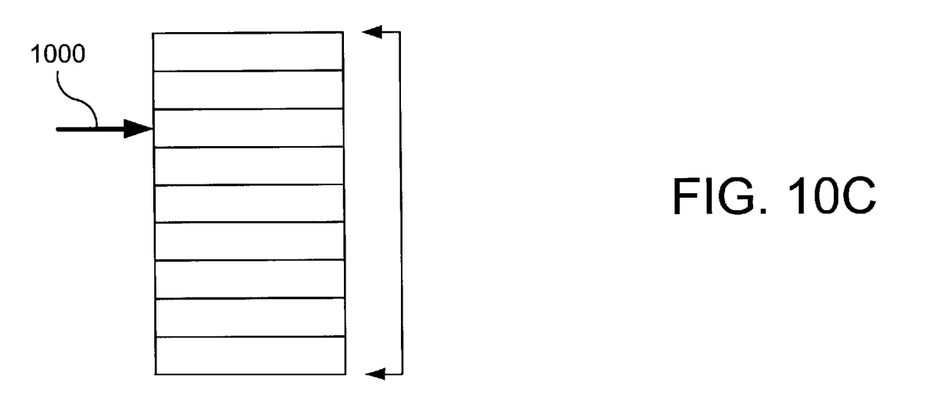

Referring now to FIGS. 10A, 10B, and 10C, a series of diagrams shows one embodiment of the operation of an EVEN-CHX-PT1 pointer 1000, in accordance with the present invention. Unlike pointer 900, pointer 1000 points at a sample value which is used in the calculation of the filtered sample values: the central even-numbered sample value. The central even-numbered sample value is the sample value which is logically right shifted and added to the filter sum. In FIG. 10A, corresponding to the time shown in FIG. 9A, the pointer 1000 points to the current central even-numbered sample value. After this central even-numbered sample value is logically right shifted, the pointer 1000 is moved up one address to the next most recent sample value, as shown in FIG. 10B. This process continues with each computation of the filter sum. FIG. 10C shows the pointer 1000 at the next most recent sample value. Again the pointer has been moved up one address to point to the next subsequent most recent sample value. In this manner, pointer 1000 always points to the current central even-numbered sample value to allow logical right shifting, according to the present invention.

Figure 11A:
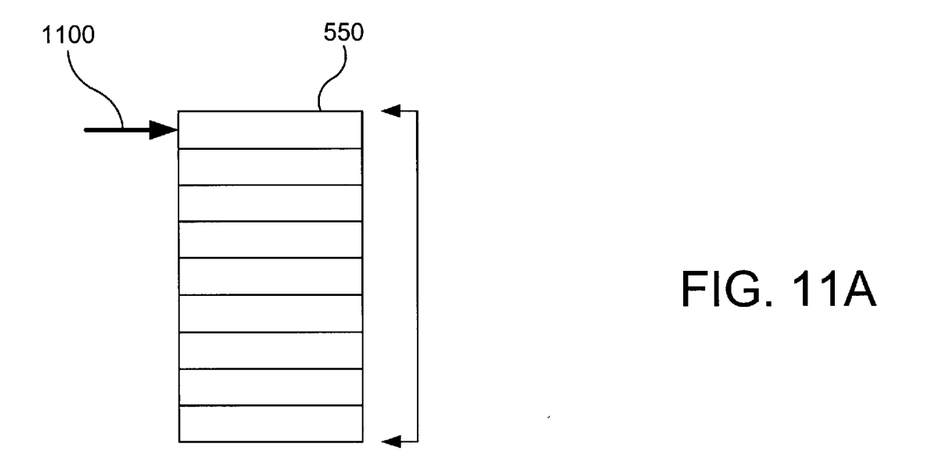
FIGS. 11A, 11B, and 11C are diagrams showing the preferred embodiment for operation of an ODD-CHX-PT0 pointer, in accordance with the present invention.
Figure 11B:
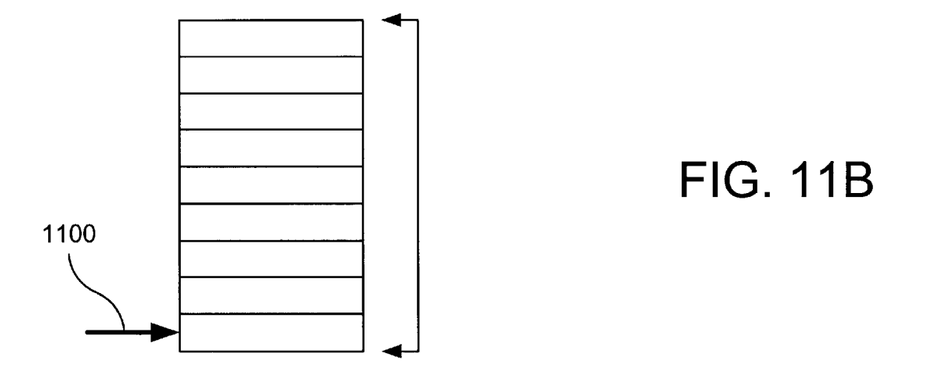
Figure 11C:
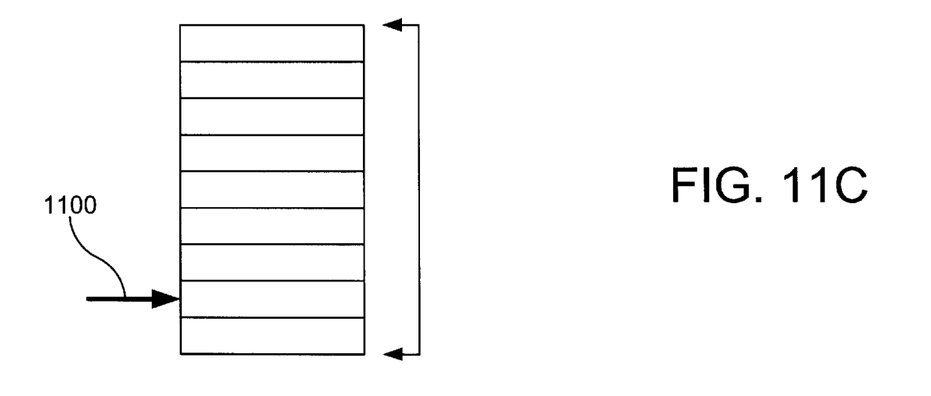

Referring now to FIGS. 11A, 11B, and 11C, a series of diagrams shows one embodiment of the operation of an ODD-CHX-PT0 pointer, in accordance with the present invention. Unlike the even channel pointers 900 and 1000, odd channel pointer 1100 is used progressively during the calculation of the filter sum. The number of locations in odd buffer 550 is 2(a)+1, which for the purpose of illustration now has the value (a)=4 so that 2(a)+1=9. In FIG. 11A, the pointer 100 is pointing at the location of the most recent odd sample value. This is the sample value which is multiplied by filter coefficient h(1). After each product h(k)×(2m−k) is added to the filter sum, pointer 100 is advanced one location in odd buffer 550 so that pointer 1100 points to the odd sample value which will be multiplied by the next coefficient. After the 2(a) multiplications have been performed, pointer 1100 has been advanced 2(a)+1 locations to the location of the oldest odd sample value, as shown in FIG. 11B. Because odd buffer 550 is designed to operate as a ring buffer, this oldest odd sample is then written over with the subsequent most recent odd sample. Pointer 100 thus points at the current most recent odd sample. As the next filter sum is completed and the DSP core software proceeds to calculate the subsequent filter sum, pointer 1100 is advanced again 2(a)+1 locations, as shown in FIG. 11C. In the case shown FIG. 11C the advancing of this many locations exceeds the length of odd buffer 550 and then returns to the top of odd buffer 550. Hence, in FIG. 11C pointer 1100 points at a location that is one before that shown in FIG. 11B. As time progresses, the pointer 1100 proceeds up the odd buffer 550, always pointing to the location for storing the current most recent odd sample. Therefore, pointer 1100, as seen previously with pointer 900, allows the odd buffer 550 to act as a ring buffer without modulo power-of-2 addressing.

Figure 12:
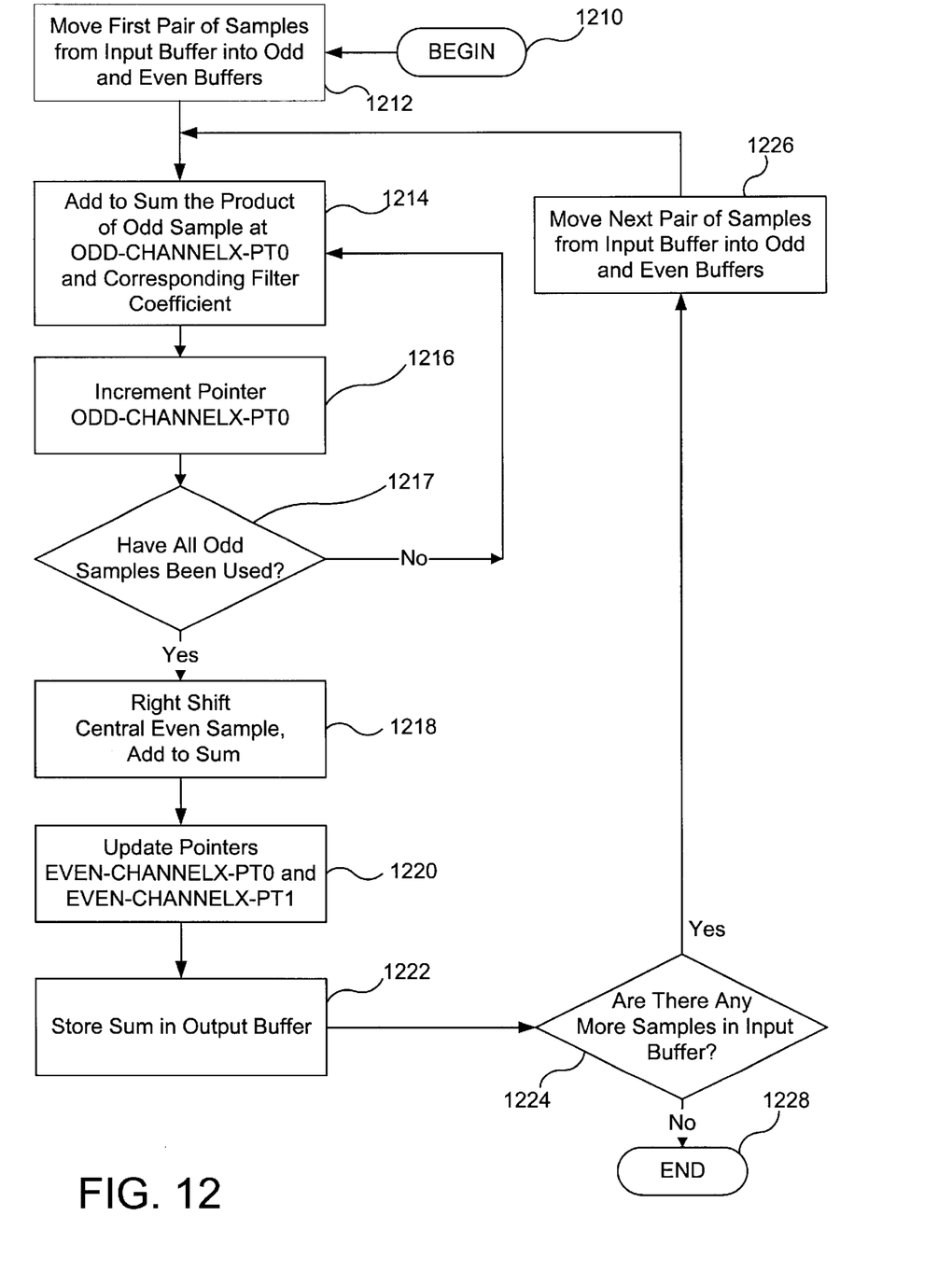
FIG. 12 is a flowchart of preferred method steps for the downsampling operation of the present invention.

Referring now to FIG. 12, a flowchart of the preferred method steps for the downsampling operation is shown, in accordance with the present invention. The flowchart of FIG. 12 describes the process of downsampling for a single channel X of digital audio data. After power is applied to DVD playback system 100 and data is read from DVD 102, input buffer 510 begins to fill with multichannel sample values. The downsampling operation then begins in step 1210. At this time, in step 1212, DSP core moves a first pair of odd and even sample values from the input buffer 510 into even buffer 540 and odd buffer 550, respectively. Using the sample values in odd buffer 550 as located by the ODD-CHANNELX-PT0 1100, in step 1214 the odd sample value pointed to by ODD-CHANNELX-PT0 1100 is fixed-point multiplied with the corresponding filter coefficient and added to the filter sum. Next, in step 1216, the ODD-CHANNELX-PT0 1100 is incremented one location. The DSP core next determines, in step 1217, if all of the odd sample values in the sample group have contributed to the filter sum. If not, then in step 1214 another odd sample value contribution is added to the filter sum.

If, conversely, all of the odd sample values of the sample group have contributed to the filter sum, then in step 1218 the central even sample value, pointed to by EVEN-CHANNELX-PT1 1000, is logically right shifted and added to the filter sum. Next, in step 1220, pointers EVEN-CHANNELX-PT0 900 and EVEN-CHANNELX-PT1 1000 are then updated. EVEN-CHANNELX-PT0 900 is thereby placed to receive the next even sample from the input buffer 510.

Next, in step 1222, the DSP core places the filter sum in the output buffer 520 for sending as a downsampled audio sample value. If the DSP core determines that there are more sample values in the input buffer 510, then decision step 1224 exits on the YES branch, and, in step 1226, the DSP core moves the next pair of odd and even sample values from the input buffer 510 into the odd buffer 550 and even buffer 540. Then the calculation of the next filter sum begins again in step 1214. If, conversely, the DSP core determines that input buffer 510 contains no further sample values, then the decision step 1224 exits on the NO branch and the process concludes at the end point 1228.

The invention has been explained above with reference to a preferred embodiment. Other embodiments will be apparent to those skilled in the art in light of this disclosure. For example, the present invention may readily be implemented using configurations and techniques other than those described in the preferred embodiment above. Additionally, the present invention may effectively be used in conjunction with systems other than the one described above as the preferred embodiment. Therefore, these and other variations upon the preferred embodiments are intended to be covered by the present invention, which is limited only by the appended claims.

What is claimed is:

1. A system for processing digital data, comprising:
   a first storage location device including a first set of said digital data;
   a second storage device including a second set of said digital data, said first set including even values and said second set including odd sample values; and
   a downsampler configured to generate a sum from said first set of said digital data and said second set of said digital data, said downsampler including a FIR filter, said FIR filter including a plurality of even coefficients and a plurality of odd coefficients, said plurality of even coefficients including a central even sample coefficient substantially equal to ½.

2. The system of claim 1 wherein said downsampler downsamples said digital data at a ratio of 2 to 1.

3. The system of claim 1 wherein said FIR filter has a length of 4(a)+1.

4. The system of claim 3 wherein said first storage device and said second storage device are buffers.

5. The system of claim 1 wherein a central even sample corresponding to said central even sample coefficient is logically right-shifted and added to said sum of said FIR filter.

6. The system of claim 1 wherein said plurality of even coefficients are each substantially equal to zero with the exception of said central even sample coefficients.

7. The system of claim 6 wherein the contributions of said even sample values corresponding to said even coefficients which are substantially equal to zero are not included in said sum of said FIR filter.

8. The system of claim 6 wherein said plurality of even coefficients are not stored.

9. The system of claim 1 wherein said first storage device and said second storage device each have 2(a)+1 storage locations.

10. The system of claim 9 further comprising a first even pointer for controlling said first storage device and an odd pointer for controlling said second storage device.

11. The system of claim 9 further comprising a second even pointer for tracking a central even sample in said first storage device.

12. A method for downsampling digital data, comprising:
    storing a first set of said digital data;
    storing a second set of said digital data, said first set including even sample values and said second set including odd sample values; and
    generating a sum from said first set of digital data and said second set of said digital data using a downsampler, said downsampler including a FIR filter, said FIR filter including a plurality of even coefficients and a plurality of odd coefficients, said plurality of even coefficients including a central even sample coefficient substantially equal to ½.

13. The method of claim 12 wherein said downsampler downsamples at a ratio of 2 to 1.

14. The method of claim 12 wherein said FIR filter has a length of 4(a)+1.

15. the method of claim 14 wherein said step of storing said first set utilizes buffers and said step of storing said second set utilizes buffers.

16. The method of claim 12 wherein a central even sample corresponding to said central even sample coefficient is logically right-shifted and added to said sum of said FIR filter.

17. The method of claim 12 wherein said plurality of even coefficients are each substantially equal to zero with the exception of said central even sample coefficient.

18. The method of claim 17 wherein the contributions of said even sample values corresponding to said even coefficients which are substantially equal to zero are not included in said sum of said FIR filter.

19. The method of claim 17 wherein said plurality of even coefficients are not stored.

20. The method of claim 12 wherein said a step of storing said first set utilizes 2(a)+1 storage locations and said step of storing said second set utilizes 2(a)+1 storage locations.

21. The method of claim 20 further comprising a first even pointer for controlling said 2(a)+1 storage locations of said first set and an odd pointer for controlling said 2(a)+1 storage locations of said second set.

22. The method of claim 20 further comprising a second even pointer for tracking a central even sample in said 2(a)+1 storage locations of said first set.

23. A computer-readable medium comprising program instructions for downsampling digital data, by performing the steps of:
storing a first set of said digital data;
storing a second set of said digital data; and
generating a sum from said first set and said second set using a downsampling filter, wherein said downsampling filter includes a FIR filter, said FIR filter including a plurality of even coefficients and a plurality of odd coefficients, said plurality of even coefficients including a central even sample coefficient substantially equal to ½.

24. A device for downsampling digital data, comprising:
means for storing a first set of said digital data;
means for storing a second set of said digital data; and
means for generating a sum from said first set and said second set using a downsampling filter, wherein said downsampling filter includes a FIR filter, said FIR filter including a plurality of even coefficients and a plurality of odd coefficients, said plurality of even coefficients including a central even sample coefficient substantially equal to ½.

\* \* \* \* \*